(12) United States Patent
Meyer et al.

(10) Patent No.: US 11,807,584 B2
(45) Date of Patent: Nov. 7, 2023

(54) METAL-CERAMIC SUBSTRATE AND METHOD FOR PRODUCING A METAL-CERAMIC SUBSTRATE

(71) Applicant: Rogers Germany GmbH, Eschenbach (DE)

(72) Inventors: Andreas Meyer, Wenzenbach (DE); Stefan Britting, Schnaittach (DE)

(73) Assignee: ROGERS GERMANY GMBH, Eschenbach (DE)

( * ) Notice: Subject to any disclaimer, the term of this patent is extended or adjusted under 35 U.S.C. 154(b) by 476 days.

(21) Appl. No.: 16/976,305

(22) PCT Filed: Feb. 18, 2019

(86) PCT No.: PCT/EP2019/053971
§ 371 (c)(1),
(2) Date: Aug. 27, 2020

(87) PCT Pub. No.: WO2019/166259
PCT Pub. Date: Sep. 6, 2019

(65) Prior Publication Data
US 2021/0188719 A1 Jun. 24, 2021

(30) Foreign Application Priority Data

Feb. 28, 2018 (DE) .......................... 102018104521.2

(51) Int. Cl.
*C04B 37/02* (2006.01)
*H05K 1/05* (2006.01)
*H05K 3/02* (2006.01)

(52) U.S. Cl.
CPC .......... *C04B 37/021* (2013.01); *C04B 37/026* (2013.01); *H05K 1/053* (2013.01);
(Continued)

(58) Field of Classification Search
None
See application file for complete search history.

(56) References Cited

U.S. PATENT DOCUMENTS

| 4,542,401 A | 9/1985 | Kaisha |
| 2009/0101392 A1 | 4/2009 | Kaga et al. |

(Continued)

FOREIGN PATENT DOCUMENTS

| DE | 10034309 A1 | 4/2001 |
| DE | 102007030389 A1 | 10/2008 |

(Continued)

OTHER PUBLICATIONS

IPRP of International Application No. PCT/EP2019/053971; International Filing Date Feb. 18, 2019; dated Jun. 8, 2020, 7 pages.

(Continued)

*Primary Examiner* — Seth Dumbris
(74) *Attorney, Agent, or Firm* — CANTOR COLBURN LLP

(57) ABSTRACT

A metal-ceramic substrate (1) comprising
an insulating layer (11) comprising a ceramic and having a first thickness (D1), and
a metallization layer (12) bonded to the insulation layer (11) and having a second thickness (D2),
wherein the first thickness (D1) is less than 250 μm and the second thickness (D2) is greater than 200 μm and wherein the first thickness (D1) and the second thickness (D2) are dimensioned such that a ratio of
an amount of the difference between a thermal expansion coefficient of the metallization layer (12) and a thermal expansion coefficient of the metal-ceramic substrate (1) to
a thermal expansion coefficient of the metal-ceramic substrate (1)

(Continued)

has a value less than 0.25, preferably less than 0.2 and more preferably less than 0.15 or even less than 0.1.

9 Claims, 4 Drawing Sheets

(52) U.S. Cl.
CPC ........ H05K 3/022 (2013.01); *C04B 2237/402* (2013.01); *C04B 2237/407* (2013.01); *C04B 2237/704* (2013.01); *C04B 2237/706* (2013.01); *H05K 2201/068* (2013.01); *Y10T 428/12535* (2015.01)

(56) References Cited

U.S. PATENT DOCUMENTS

| | | | |
|---|---|---|---|
| 2009/0151982 | A1 | 6/2009 | Oshika |
| 2012/0114966 | A1 | 5/2012 | Tuan |
| 2017/0151755 | A1 | 6/2017 | Koba |
| 2020/0375029 | A1* | 11/2020 | Sakai ................. H05K 1/0306 |

FOREIGN PATENT DOCUMENTS

| | | | | |
|---|---|---|---|---|
| DE | 102014105000 | A1 | 10/2015 | |
| DE | 102014220650 | A1 | 4/2016 | |
| EP | 0789397 | A2 | 8/1997 | |
| EP | 922682 | A1 * | 6/1999 | ........... C04B 37/026 |
| EP | 3248956 | A1 | 11/2017 | |
| EP | 3358615 | A1 | 8/2018 | |
| JP | 2003168770 | A | 6/2003 | |
| JP | 2003286087 | A | 10/2003 | |
| JP | 2012023404 | A | 2/2012 | |
| JP | 2013042165 | A | 2/2013 | |
| JP | 2017224656 | A * | 12/2017 | |
| JP | 2017224656 | A | 12/2017 | |
| WO | 2017026606 | A1 | 2/2017 | |
| WO | 2017056666 | A1 | 4/2017 | |

OTHER PUBLICATIONS

Bernd Lehmeier et al.: "Curamik ceramic substrate—DBG technology—Design rules"; pp. 1-14.
Wikipedia_Ausdehnungskoeffizient_2017_Volltext, 7 pages.
Wikipedia_Elastizitatsmodul_2018_Volltext, 7 pages.
Wikipedia_Poissonzahl_2017_Volltext, 5 pages.
Wikipedia_Querkontraktion_2017_Volltext, 2 pages.

* cited by examiner

METAL-CERAMIC SUBSTRATE AND METHOD FOR PRODUCING A METAL-CERAMIC SUBSTRATE

CROSS-REFERENCE TO RELATED APPLICATIONS

This application is a National Stage filing of PCT/EP2019/053971, filed Feb. 18, 2019, which claims priority to DE 10 2018 104 521.2, filed Feb. 28, 2018, both of which are incorporated by reference in their entirety herein.

BACKGROUND

The present invention concerns a metal-ceramic substrate for electrical, in particular electronic, components and a method for producing a metal-ceramic substrate.

Metal-ceramic substrates are, for example, sufficiently well known as state-of-the-art printed circuit boards or circuit boards. Typically, connecting surfaces for electrical components and conductor tracks are arranged on a component side of the metal-ceramic substrate, wherein the electrical components and the conductor tracks can be interconnected to form electrical circuits. Essential components of metal-ceramic substrates are an insulation layer made of a ceramic and a metallization layer bonded to the insulation layer. Because of their comparatively high insulation strength, insulation layers made of ceramic have proven to be particularly advantageous. By structuring the metallization layer, conductor tracks and/or connecting surfaces for the electrical components can be realized.

From WO 2017 056 666 A1 an $Si_3N_4$ insulation layer with a two-sided metallization layer is known, wherein the $Si_3N_4$ insulation layer is thinner than 0.26 mm and the metallization layers are dimensioned thicker than 0.6 mm.

In principle, in addition to low thermal resistance, high temperature change resistance is also desirable, which contributes to the durability of the corresponding metal-ceramic substrate.

SUMMARY

Starting from this background, the present invention makes it its task to provide a metal-ceramic substrate with a low thermal resistance and a comparatively high temperature change resistance.

This task is solved by a metal-ceramic substrate and a method as described herein. Further advantages and features of the invention result from the dependent claims as well as the description and the attached figures.

According to the present invention a metal-ceramic substrate is provided, comprising
- an insulating layer comprising a ceramic and having a first thickness, and
- a metallization layer bonded to the insulation layer and having a second thickness, wherein the first thickness is less than 250 μm and the second thickness is greater than 200 μm and wherein the first thickness and the second thickness are dimensioned such that a ratio of
- an amount of the difference between a thermal expansion coefficient of the metallization layer and a thermal expansion coefficient of the metal-ceramic substrate to
- a thermal expansion coefficient of the metal-ceramic substrate has a value less than 0.25, preferably less than 0.2 and more preferably less than 0.15 or even less than 0.1.

BRIEF DESCRIPTION OF THE FIGURES

Further advantages and features result from the following description of preferred embodiments of the subject matter of the invention with reference to the attached figures. Individual features of the individual embodiments can be combined within the scope of the invention.

DETAILED DESCRIPTION

Figure 1:
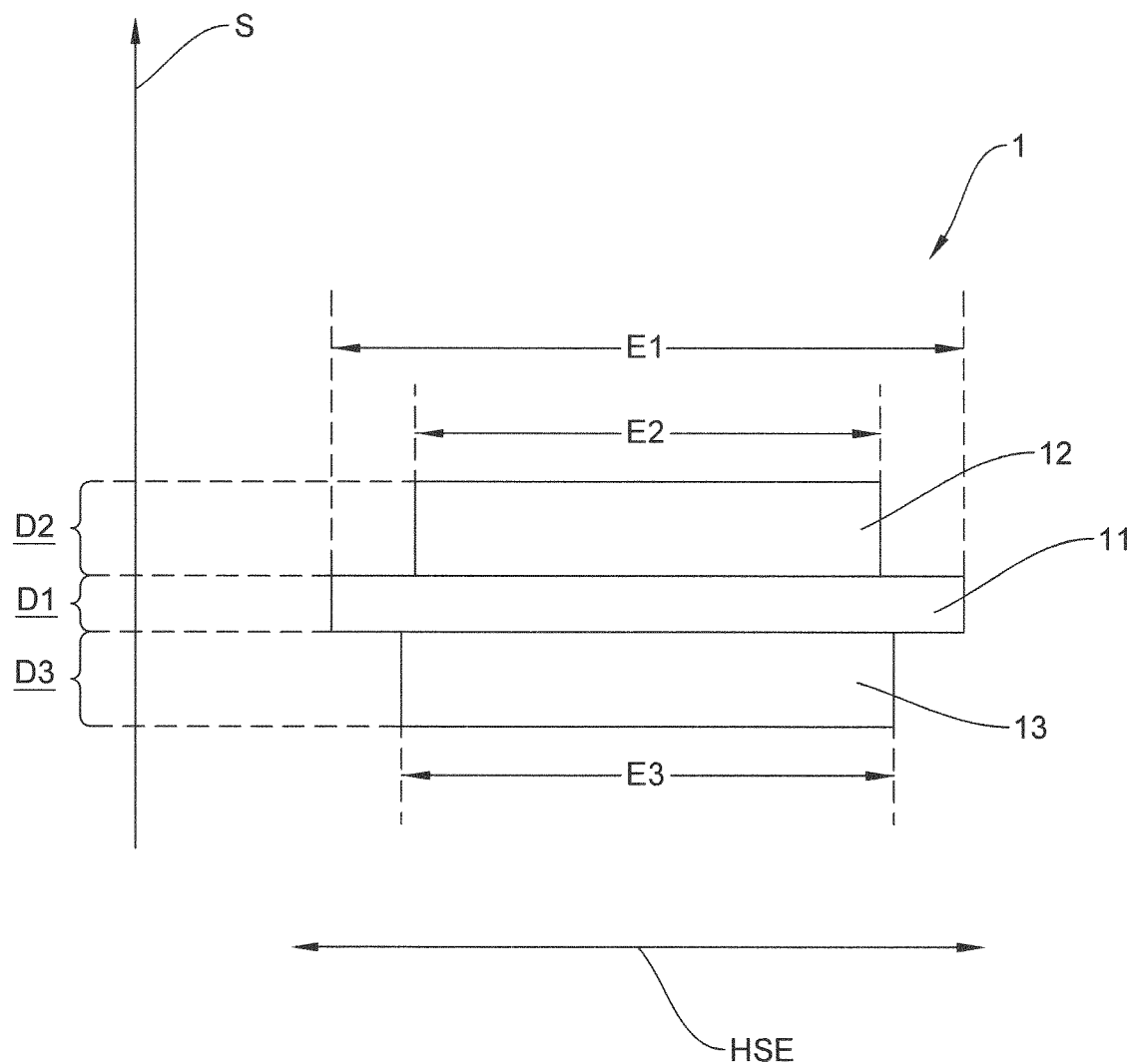
FIG. 1: Metal-ceramic substrate according to a first preferred embodiment of the present invention

Compared to the state of the art, it is possible with the configuration or dimensioning of the first thickness and the second thickness in accordance with the invention to realize an improved temperature change resistance, especially for such metal-ceramic substrates whose thermal resistance is reduced by a comparatively thin insulating layer, i.e. with a first thickness of less than 250 μm, preferably less than 200 μm and especially preferably less than 150 μm. According to the invention, the thermal expansion coefficient of the metal-ceramic substrate (i.e. the total thermal expansion coefficient, which takes into account all layers, in particular the insulation layer and the metallization layer) and the thermal expansion coefficient of the metallization layer are used for dimensioning the first and/or the second thickness. Surprisingly, it turned out that despite the comparatively small first thicknesses of the insulation layer, the temperature change resistance can be improved if the second thickness or first thickness is dimensioned according to claimed requirements. In particular, it has been shown that the smaller the difference between the thermal expansion coefficient of the metallization layer and the thermal expansion coefficient of the metal-ceramic substrate, the lower the failure of a metal-ceramic substrate under thermal changes.

A further advantage, apart from the reduced thermal resistance of the comparatively thin insulation layer, is that the number and size of structural defects decreases with decreasing layer thickness. Accordingly, the probability of failure of the ceramic insulation layer also decreases. The first thickness and the second thickness are measured along a direction perpendicular to the main extension plane, having the main extension plane parallel to the insulation layer. The metallization layer is directly attached to the insulation layer via a bonding surface.

Temperature change resistance is preferably understood to be a tearing of the insulation layer in the area of the boundary to the metallization layer. This tearing, in turn, leads to delamination as the number of cycles increases. The durability of the metal-ceramic substrate, which can be observed under temperature changes, ends when a crack can be detected by US microscopy, which in turn hinders the heat dissipation below the heat sources or in the area of half the copper thickness around the heat source or restricts the insulating strength of the substrate. It has been found that the lifetime observed under temperature changes can be extended if the metal-ceramic substrate is dimensioned according to claimed requirements.

Preferably, the insulation layer comprises $Al_2O_3$, $Si_3N_4$, AlN, an HPSX ceramic (i.e., a ceramic with an $Al_2O_3$ matrix, which comprises an x-percent portion of $ZrO_2$, for example $Al_2O_3$ with 9% $ZrO2$=HPS9 or $Al_2O_3$ with 25% $ZrO_2$=HPS25), SiC, BeO, MgO, high-density MgO (>90% of the theoretical density), TSZ (tetragonally stabilized zirconium oxide) or ZTA as the material for the ceramic. It is also conceivable here that the insulating layer is designed as a composite or hybrid ceramic, in which, in order to combine various desired properties, several ceramic layers, each differing in terms of their material composition, are arranged one above the other and joined together to form an insulating layer. The materials conceivable as materials for the metallization layer are copper, aluminium, molybdenum and/or their alloys, as well as laminates such as CuW, CuMo, CuAl, AlCu and/or CuCu, in particular a copper sandwich structure with a first copper layer and a second copper layer, a grain size in the first copper layer differing from a second copper layer.

Furthermore, it is conceivable that the insulating layer could include, for example, zirconia-reinforced aluminium oxide, which would have the advantage of increasing the stability of the insulating layer, while, for example, an insulating layer of $Al_2O_3$ could be produced comparatively cheaply.

For example, an insulation layer made of HPS9 ceramic has a first thickness of 0.26 mm or 0.32 mm if the second thickness of the metallization layer made of copper is essentially 0.6 mm.

According to a further embodiment of the present invention, it is provided that the first thickness is greater than 30 µm, preferably greater than 60 µm and more preferably greater than 90 µm. It turned out that such first thicknesses can ensure a corresponding insulation strength and stability of the metal-ceramic substrate. In addition, the manufacturing costs for insulation layers with a first thickness of more than 90 µm are lower than those for thinner insulation layers.

Preferably, it is provided that on the side opposite the metallization layer a further metallization layer having a third thickness is bonded to the insulation layer, the first thickness, the second thickness and/or the third thickness being dimensioned such that a ratio of an amount of the difference between a thermal expansion coefficient of the further metallization layer and/or the metallization layer and a thermal expansion coefficient of the metal-ceramic substrate to thermal expansion coefficients of the metal-ceramic substrate has a value less than 0.25, preferably less than 0.2 and more preferably less than 0.15, or even less than 0.1.

The metal-ceramic substrate is preferably thermo-mechanically symmetrical. In particular, the metallization layer, the insulation layer and the further metallization layer are arranged one above the other along a stacking direction perpendicular to the main extension plane. The third thickness is dimensioned in a direction perpendicular to the main extension plane. Preferably, the thermal expansion coefficient of the further metallization layer or the metallization layer is selected which is closer to the thermal expansion coefficient of the metal-ceramic substrate. It is obvious to the skilled person that the formulated requirements are transferable to metal-ceramic substrates composed of more than three layers. Preferably, such a multilayer metal-ceramic substrate with more than three layers can be transferred to a metal-ceramic substrate with an insulating layer, a metallization layer and a further metallization layer, i.e. a three-layer metal-ceramic substrate. Preferably, the material for the second metallization layer is selected in order to increase the stiffness of the entire metal-ceramic substrate. This allows the mechanical load capacity of the entire metal-ceramic substrate to be specifically adjusted. It is conceivable that the material for the first metallization layer differs from the metal of the second metallization layer. For example, the material for the further metallization layer is molybdenum. Also conceivable as materials for the further metallization layer are copper, aluminium, tungsten and/or their alloys, as well as laminates such as CuW, CuMo, CuAl, AlCu and/or CuCu, in particular a copper sandwich structure with a first copper layer and a second copper layer, wherein a grain size in the first copper layer differs from a second copper layer. Furthermore, backside metallizations based on MMC's such as CuSiC, CuC, AlSiC or MgSiC are also conceivable, the CTE of which can be adapted in particular to the combined CTE of the substrate and/or the chip. It is particularly preferred that the further metallization layer is between 1.1 and 10 times as thick, preferably between 1.5 and 8, and more preferably between 2 and 6 times as thick as the metallization layer.

Preferably, the further metallization layer is free of interruptions for stabilization, especially free of isolation trenches. This prevents the metal-ceramic substrate in the area of the insulation trenches from being formed only by the thin insulation layer and being correspondingly susceptible to breakage in this area. In other words: the further metallization layer serves as a stabilizing layer for the comparatively thin insulation layer. It is also conceivable that the metallization and the further metallization are configured in such a way that, along the stacking direction, insulation trenches in the metallization layer and the insulation trenches in the further metallization layer are not arranged one above the other. It also turned out that despite the asymmetrical design of the further metallization layer and the metallization layer, comparatively long lifetimes can be realized. Preferably, the further metallization layer extends further than the metallization layer in a direction parallel to the main extension plane. This means that the further metallization layer protrudes from the metallization layer in a direction parallel to the main extension plane. It is also conceivable that the further metallization layer is thicker than the metallization layer in order to ensure sufficient stability of the metal-ceramic substrate. In other words, the thicker further metallization layer at least partially compensates for the reduced thickness of the insulation layer.

In a further embodiment of the present invention, it is provided that the second thickness and/or the third thickness is greater than 350 µm, and more preferably greater than 500 µm. The second thickness of the metallization layer, which is larger than the first thickness, serves advantageously to limit the heating of the conductor tracks by ohmic losses in a current conduction to spread the heat below the heat sources and to minimize bending of the metal-ceramic substrate. This can be ensured especially for thicknesses above 500 µm for a majority of the different metallization layers.

Preferably, the thermal expansion coefficient depends on material-specific parameters and/or a Poisson's number. For example, the thermal expansion coefficient depends on a module of elasticity, the Poisson's number, and/or a material-specific thermal expansion coefficient. In particular, the following relationship applies $$CTE = \frac{\sum_{i=1}^{n} CTE_i \cdot \frac{E_i}{(1-\eta_i)} \cdot Di}{\sum_{i=1}^{n} \frac{E_i}{(1-\eta_i)} \cdot Di},$$

wherein Di is the i-th thickness of n layers with the respective material-specific, thermal expansion coefficient $CTE_i$. In addition, the Poisson number $\eta_i$ the shape of the respective layer and its module of elasticity $E_i$ is taken into account. By means of this correlation, the respective thermal expansion coefficient can be determined on the basis of material-specific sizes and dimensioning data, which allows a comparison between the respective coefficients of thermal expansion.

It is expedient that the second thickness and the third thickness are essentially the same. Preferably, the metallization layer and the further metallization layer are made of the same material. It is also conceivable that the third thickness and/or the choice of material are adapted to the further metallization layer in order to realize a desired size dimension of the metallization layer and the insulation layer.

Another aspect of the present invention is a method for producing a metal-ceramic substrate comprising
  providing an insulating layer comprising a ceramic having a first thickness, wherein the first thickness is less than 300 μm,
  providing a metallization layer bonded to the insulation layer and having a second thickness, the second thickness being greater than 200 μm, and
  bonding of the metallization layer to the insulation layer
wherein the first thickness and/or the second thickness are dimensioned such that a ratio of
  an amount of the difference between a thermal expansion coefficient of the metallization layer and a thermal expansion coefficient of the metal-ceramic substrate to
  a thermal expansion coefficient of the metal-ceramic substrate
has a value less than 0.25, preferably less than 0.2, and more preferably less than 0.15 or even less than 0.1.

All features described for the metal-ceramic substrate according to the invention and their advantages can also be transferred analogously to the method according to the invention and vice versa. Preferably, when determining the first thickness, the second thickness and/or the third thickness, one should first assume a desired total thickness of the metal-ceramic substrate. The preferred second thickness and/or first thickness is then determined, and then the first thickness, the second thickness and, if necessary, the third thickness are determined based on the coefficients of thermal expansion.

According to a preferred embodiment of the present invention, it is provided that the metallization layer is bonded to the insulation layer by means of a DCB process or an active soldering process.

A "DCB process" (Direct Copper Bond Technology) or "DAB process" (Direct Aluminium Bond Technology) is understood by the skilled person to be such a process, which serves, for example, to bond metal layers or sheets (e.g. copper sheets or foils) to each other and/or to ceramics or ceramic layers, using metal or copper sheets or metal or copper foils which have a layer or coating (melting layer) on their surface sides. In this process, described for example in U.S. Pat. No. 3,744,120 A or DE23 19 854 C2, this layer or coating (fusible layer) forms a eutectic with a melting temperature below the melting temperature of the metal (e.g. copper), so that by placing the foil on the ceramic and heating all the layers, they can be joined together by melting the metal or copper essentially only in the area of the fusible layer or oxide layer.

In particular, the DCB process then has, for example, the following process steps:
  Oxidizing a copper foil in such a way that a uniform copper oxide layer is obtained;
  Place the copper foil on the ceramic layer;
  Heating the composite to a process temperature between about 1025 to 1083° C., e.g. to about 1071° C.;
  Cool down to room temperature.

An active soldering process, e.g. for joining metal layers or metal foils, in particular also copper layers or copper foils with ceramic material, is a process which is also specifically used for the production of metal-ceramic substrates. Here, at a temperature between approx. 650-1000° C., a connection is made between a metal foil, for example a copper foil, and a ceramic substrate, for example aluminium nitride ceramic, using a brazing alloy which, in addition to a main component such as copper, silver and/or gold, also comprises an active metal. This active metal, which is for example at least one element of the group Hf, Ti, Zr, Nb, Ce, forms a connection between the solder and the ceramic by chemical reaction, while the connection between the solder and the metal is a metallic brazing connection.

Alternatively, a DAB process for aluminium metallization and/or a thick-film process are also known for the bonding.

Preferably, it is provided that the metal-ceramic substrates are separated by laser scribing, laser cutting and/or water jet cutting. In this way, the individual metal-ceramic substrates can be provided easily and comparatively quickly after they have been jointly formed in a previous process. Preferably, the metal-ceramic substrates are realized by means of a cutting process, for example by laser scribing, laser cutting and/or water jet cutting, especially from a master card, if the further metallization layer is free of interruptions or etchings. This supports the successful separation of substrates, which can only be separated by breaking at great expense or with difficulty due to the particularly continuous further metallization layer.

In the sense of the invention, the term essentially means deviations from the exact value in each case by +/−15%, preferably by +/−10% and more preferably by +/−5% and/or deviations in the form of changes which are insignificant for the function.

FIG. 1 shows a metal-ceramic substrate 1 according to a preferred embodiment of the present invention. Such metal-ceramic substrates 1 preferably serve as carriers of electronic or electrical components, which can be attached to the metal-ceramic substrate 1. Essential components of such a metal-ceramic substrate 1 are an insulation layer 11 extending along a main extension plane HSE and a metallization layer 12 bonded to the insulation layer 11. The insulation layer 11 is made of at least one material comprising a ceramic. The metallization layer 12 and the insulating layer 11 are arranged one above the other along a stacking direction S extending perpendicularly to the main extension plane HSE.

The insulating layer 11 has a first thickness D1 perpendicular to the main extension plane HSE or parallel to the stacking direction S and a first extension E1 parallel to the main extension plane HSE, and the metallization layer 12 has a second thickness D2 perpendicular to the main extension plane HSE or parallel to the stacking direction S and a second extension E2 parallel to the main extension plane HSE. In a direction parallel to the stacking direction S, a further metallization layer 13 is preferably bonded to the insulation layer 12 on the side of the insulation layer 11 opposite the metallization layer 12. The further metallization layer 13 has a third thickness D3 measured perpendicular to the main extension plane HSE or parallel to the stacking direction S and a third first extension E3 measured parallel to the main extension plane HSE. The metallization layer 12 and/or the further metallization layer 13 are preferably structured, for example structured by etching or surface milling, in order to provide, for example, by means of the structured metallization layer 12 conductor tracks and/or connecting surfaces for electrical circuits.

In order to reduce the thermal resistance, it is preferably provided that the metal-ceramic substrate 1 has an insulating layer 11 with a first thickness D1 of less than 300 μm, while the second thickness D2 of the metallization layer 12 and/or the third thickness D3 of the further metallization layer 13 has a value of more than 200 μm, more preferably more than 500 μm. In other words, it is provided that the insulation layer 11 should be thinner than the metallization layer 12 and the further metallization layer 13, respectively. Thereby, a comparatively thin insulation layer 11 has proven to be particularly advantageous for low thermal resistance.

In order to counteract heating of the conductor tracks due to ohmic losses during the conduction of current, as well as to improve the heat spread and minimize bending of the metal-ceramic substrate 1, the second thickness D2 of the metallization layer 12 and/or the third thickness D3 of the further metallization layer 13 are dimensioned comparably thick, i. e. preferably thicker than the first thickness D1 of the insulation layer 11. In the embodiment shown in FIG. 1, the further metallization layer 13 is arranged in a direction perpendicular to the main extension plane HSE at least in some areas, preferably completely, congruent with the metallization layer 12. Thereby, the further metallization layer 13 extends further than the metallization layer 12 in a direction parallel to the main extension plane HSE. A ratio of the third extension E3 of the further metallization layer 13 measured parallel to the main extension plane HSE to the second extension E2 of the metallization layer 12 measured parallel to the main extension plane HSE preferably has a value between 1.01 and 1.4, more preferably between 1.01 and 1.2 times and most preferably between 1.05 and 1.15. The metallization layer 12 may in turn be interrupted by circuit-related structures.

The durability of the metal-ceramic substrate 1 is significantly determined by its temperature change resistance. It has been shown that with small first thicknesses D1 of the insulation layer 11 it is possible to optimize the temperature change resistance by dimensioning the first thickness D1 of the insulation layer 11 as well as the second thickness D2 of the metallization layer 12 and the third thickness D3 of the further metallization layer D13. In this connection, it is preferably provided that the first thickness D1, the second thickness D2 and/or the third thickness D3 be adjusted in such a way that a ratio an amount of the difference between a thermal expansion coefficient of the metallization layer 12 or of the further metallization layer 13 and a thermal expansion coefficient of the metal-ceramic substrate 1 to the thermal expansion coefficient of the metal-ceramic substrate 1 has a value less than 0.25, preferably less than 0.2 and more preferably less than 0.15 or even less than 0.1.

The following relationship is used to determine the thermal expansion coefficient of the metal-ceramic substrate 1, the first metallization layer 12 and the second metallization layer 13, respectively $$CTE = \frac{\sum_{i=1}^{n} CTE_i \cdot \frac{E_i}{(1-\eta_i)} \cdot Di}{\sum_{i=1}^{n} \cdot \frac{E_i}{(1-\eta_i)} \cdot Di},$$

wherein Di is the i-th thickness of n layers with the respective $CTE_i$. In addition, by the Poisson number $\eta_i$ the shape of the respective layer and its module of elasticity $E_i$ is taken into account.

Figure 2:
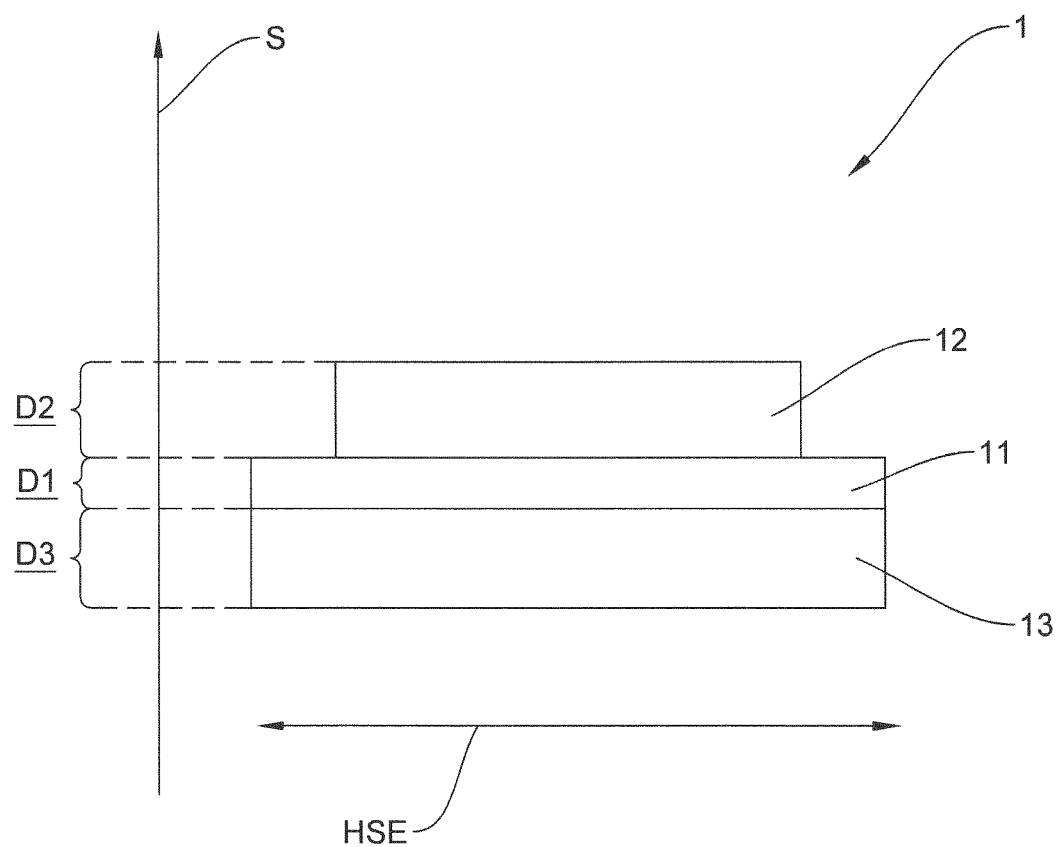
FIG. 2: Metal-ceramic substrate according to a second preferred embodiment of the present invention

FIG. 2 shows a metal-ceramic substrate 1 according to a second preferred embodiment of the present invention. The metal-ceramic substrate 1 in FIG. 2 differs substantially only from that in FIG. 1 in that the further metallization layer 13 extends along the entire extension, i.e. the first extension E1, of the insulation layer 11. In other words: the further metallization layer 13 is flush with the insulation layer 11 in a direction parallel to the main extension plane HSE, preferably on all sides, i.e. the first extension E1 is equal to the third extension E3. However, it is also conceivable that the second extension E2 of the metallization layer 12 along the main extension plane HSE is greater than the third extension E3 of the further metallization layer 13, without the further metallization layer 13 being flush with the insulation layer 11. For example, it is conceivable that the further metallization layer 13 protrudes in a direction parallel to the main extension plane HSE with respect to the metallization layer 12, preferably by a distance which is smaller, larger or equal to the distance between an outermost circumference of the insulation layer 11 and an outermost circumference of the metallization layer 12 in the same direction.

Figure 3:
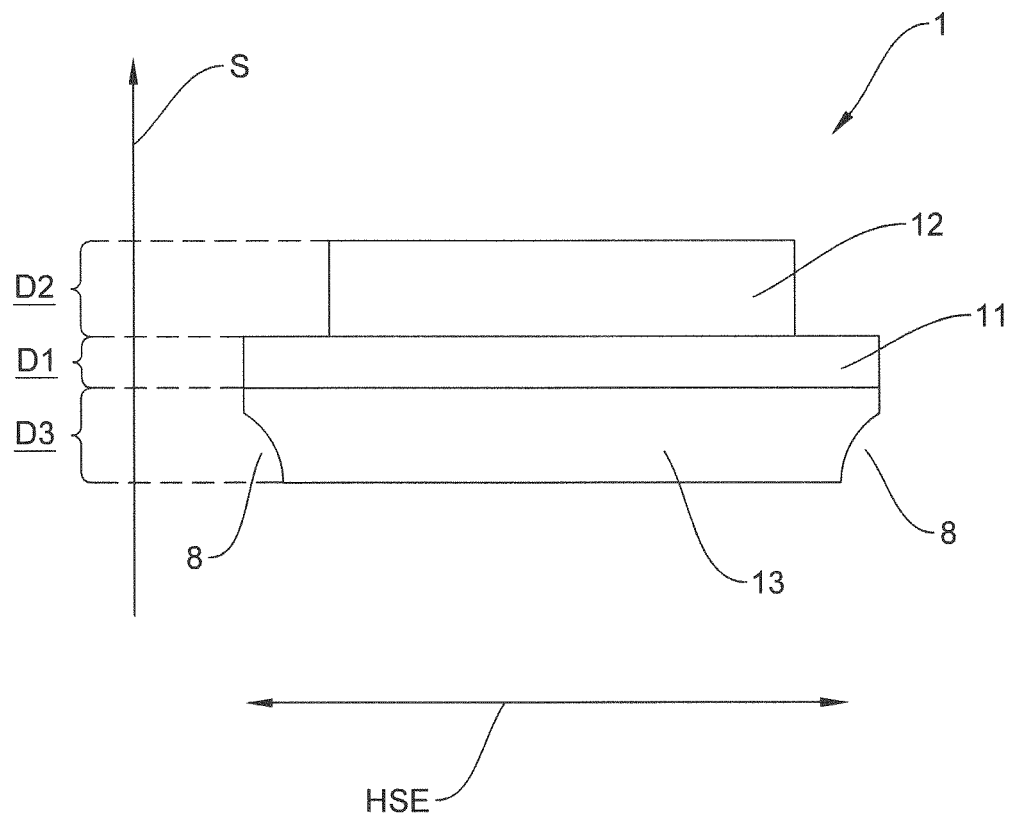
FIG. 3: Metal-ceramic substrate according to a third preferred embodiment of the present invention.

FIG. 3 shows a metal-ceramic substrate 1 according to a third preferred embodiment of the present invention. The metal-ceramic substrate 1 in FIG. 3 differs substantially only from that in FIG. 2 in that the further metallization layer 13 has a recess, weakening or thickness taper 8, especially on its side opposite to the insulation layer 11. The recess 8 is preferably provided in the edge area of the further metallization layer 13. For example, the recess 8 is etched into the further metallization layer 13.

Figure 4:
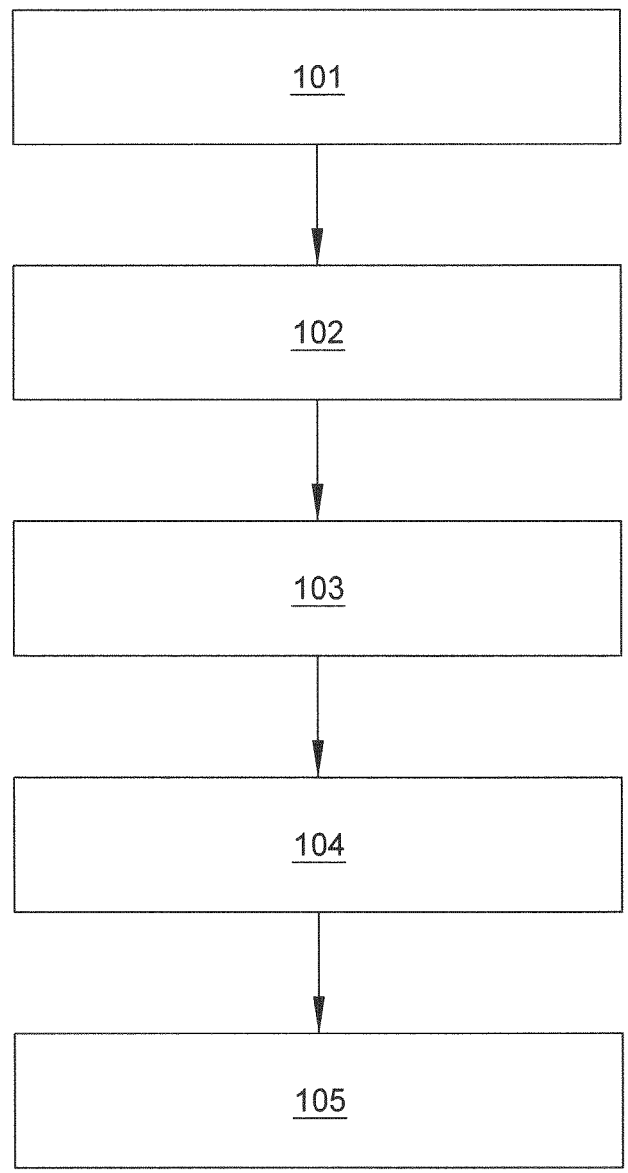
FIG. 4: schematically a flow chart for a method for producing a metal-ceramic substrate according to a preferred embodiment of the present invention

FIG. 4 schematically illustrates in a flow chart a method for the production of a metal-ceramic substrate 1. It is preferably provided, for example, to provide an insulating layer 11 having a first thickness D1, the first thickness D1 of the insulating layer 11 being less than 300 μm. After providing 101 or defining the insulation layer 11, a second thickness D2 is preferably determined or established using the above-mentioned relationship with the $CTE_i$ for the metallization layer 12 and/or the further metallization layer 13 as well as its module of elasticity and Poisson's number, in such a way that a ratio between an amount of the difference between a thermal expansion coefficient of the metallization layer 12 or the further metallization layer 13 and a thermal expansion coefficient of the metal-ceramic substrate 1 to a thermal expansion coefficient of the metal-ceramic substrate 1 has a value less than 0.25, preferably less than 0.2, and more preferably less than 0.15 or even less than 0.1. After determining 102, a metallization layer 12 having the second thickness D2 is bonded to the insulation layer 11, preferably using an active soldering process or a DAB process, or more preferably a DCB process.

Furthermore, it is provided that, in addition to the metallization layer 11, a further metallization layer 13 having the third thickness D3 is taken into account when determining the second thickness D2. It is preferably provided that after the bonding 103, which preferably takes place together with the determination 102, the metal-ceramic substrates 1 are separated by means of laser scribing or laser cutting and/or the metallization layer 11 is structured by an etching process, for example; i.e. separation 105 and/or structuring 104 of the metal-ceramic substrate 1 follows. Preferably, the further metallization layer 13 remains structure-free, at least the further metallization layer 13 does not have any through-etched structures, in order to improve the stability of the entire metal-ceramic substrate 1.

REFERENCE CHARACTER LIST 1 metal-ceramic substrate
8 recess
11 insulation layer
12 metallization layer
13 further metallization layer
E1 first extension
E2 second extension
E3 third extension
HSE main plain extension
S stacking direction
D1 first thickness
D2 second thickness
D3 third thickness
101 providing an insulating layer
102 determining the second thickness
103 bonding
104 structuring
105 separating

The invention claimed is:

1. A metal-ceramic substrate (1) comprising
an insulating layer (11) comprising a ceramic and having a first thickness (D1), and
a metallization layer (12) bonded to the insulation layer (11) and having a second thickness (D2),
wherein the metallization layer (12) is bonded to the insulation layer (11) by means of a direct copper bonding (DCB) process, direct aluminum bonding (DAB) process or an active soldering process
wherein the first thickness (D1) is less than 200 μm and the second thickness (D2) is greater than 200 μm and wherein the first thickness (D1) and the second thickness (D2) are dimensioned such that a ratio of
an amount of the difference between a thermal expansion coefficient of the metallization layer (12) and a thermal expansion coefficient of the metal-ceramic substrate (1) to
a thermal expansion coefficient of the metal-ceramic substrate (1) has a value less than 0.2.

2. The metal-ceramic substrate (1) according to claim 1, wherein the first thickness (D1) is greater than 30 μm.

3. The metal-ceramic substrate (1) according to claim 1, wherein on the side opposite the metallization layer (12), a further metallization layer (13) having a third thickness (D3) is bonded to the insulating layer (11), wherein the first thickness (D1), the second thickness (D2) and/or the third thickness (D3) are dimensioned such that a ratio of
an amount of the difference between a thermal expansion coefficient of the further metallization layer (13) and/or the metallization layer (12) and a thermal expansion coefficient of the metal-ceramic substrate (1) to
a thermal expansion coefficient of the metal-ceramic substrate (1) has a value less than 0.2.

4. The metal-ceramic substrate (1) according to claim 3, wherein for stabilisation purposes the further metallisation layer (13) is free from interruptions.

5. The metal-ceramic substrate (1) according to claim 1, wherein the second thickness (D2) and/or a third thickness (D3) is greater than 300 μm.

6. The metal-ceramic substrate (1) according to claim 1, wherein the thermal expansion coefficient depends on material-specific parameters and/or a Poisson's number.

7. The metal-ceramic substrate (1) according to claim 5, wherein the second thickness (D2) and the third thickness (D3) are substantially the same.

8. The metal-ceramic substrate (1) according to claim 1, wherein a ratio of a third extension (E3) of a further metallization layer (13) measured parallel to the main extension plane (HSE) to a second extension (E2) of the metallization layer (12) measured parallel to the main extension plane (HSE) has a value between 1.01 and 1.4.

9. The metal-ceramic substrate (1) according to claim 4, wherein for stabilization purposes the further metallization layer (13) is free from insulation trenches.

* * * * *